(12) United States Patent
Huang et al.

(10) Patent No.: US 10,777,455 B2
(45) Date of Patent: Sep. 15, 2020

(54) MULTI-ETCHING PROCESS FOR FORMING VIA OPENING IN SEMICONDUCTOR DEVICE STRUCTURE

(71) Applicant: Taiwan Semiconductor Manufacturing Co., Ltd., Hsinchu (TW)

(72) Inventors: Chun-Jui Huang, New Taipei (TW); Li-Te Lin, Hsinchu (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/260,536

(22) Filed: Jan. 29, 2019

(65) Prior Publication Data
US 2020/0243385 A1  Jul. 30, 2020

(51) Int. Cl.
*H01L 21/768* (2006.01)
*H01L 21/311* (2006.01)
*H01L 21/02* (2006.01)
*H01L 29/66* (2006.01)

(52) U.S. Cl.
CPC .... *H01L 21/76897* (2013.01); *H01L 21/0217* (2013.01); *H01L 21/02063* (2013.01); *H01L 21/31116* (2013.01); *H01L 21/76802* (2013.01); *H01L 21/76826* (2013.01); *H01L 21/76877* (2013.01); *H01L 29/66795* (2013.01); *H01L 21/02271* (2013.01); *H01L 21/31144* (2013.01); *H01L 29/6656* (2013.01); *H01L 29/66545* (2013.01); *H01L 29/66636* (2013.01)

(58) Field of Classification Search
CPC ....... H01L 2924/00; H01L 2224/73265; H01L 29/785; H01L 27/0886; H01L 27/0924; H01L 21/823821; H01L 21/76897; H01L 21/76877; H01L 27/10879; H01L 21/30604; H01L 21/31111; H01L 21/31138; H01L 21/02063; H01L 21/0217
USPC ........................................................ 438/586
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |

(Continued)

*Primary Examiner* — Duy T Nguyen
(74) *Attorney, Agent, or Firm* — Birch, Stewart, Kolasch & Birch, LLP

(57) ABSTRACT

A method for forming a semiconductor device structure is provided. A gate structure and a source/drain contact structure are formed over a substrate. The gate structure is covered with a capping layer. The capping layer and the source/drain contact structure are successively covered with a first insulating layer and a second insulating layer. A via opening is formed in the second insulating layer to expose the first insulating layer above the source/drain contact structure. The exposed first insulating layer is recessed using a first etching gas mixture including an oxygen gas, to leave a portion of the first insulating layer. The left portion of the first insulating layer using a second etching gas mixture including a hydrogen gas, to expose the source/drain contact structure. A conductive material is formed in the via opening to electrically connect the source/drain contact structure.

20 Claims, 13 Drawing Sheets

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2016/0043206 A1* | 2/2016 | Ikegami | H01L 29/7397 257/139 |
| 2017/0186849 A1* | 6/2017 | Chen | H01L 29/6656 |
| 2017/0194211 A1* | 7/2017 | Lai | H01L 21/76897 |
| 2018/0219010 A1* | 8/2018 | Kim | H01L 29/785 |
| 2019/0164829 A1* | 5/2019 | Yang | H01L 23/535 |

* cited by examiner

MULTI-ETCHING PROCESS FOR FORMING VIA OPENING IN SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, as the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET).

Although advantages of the FinFET may include reducing the short channel effect and raising the current flow, fabrication processes continue to become more difficult to perform since feature sizes continue to decrease. For example, there is a challenge to form reliable via structures for the FinFET at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
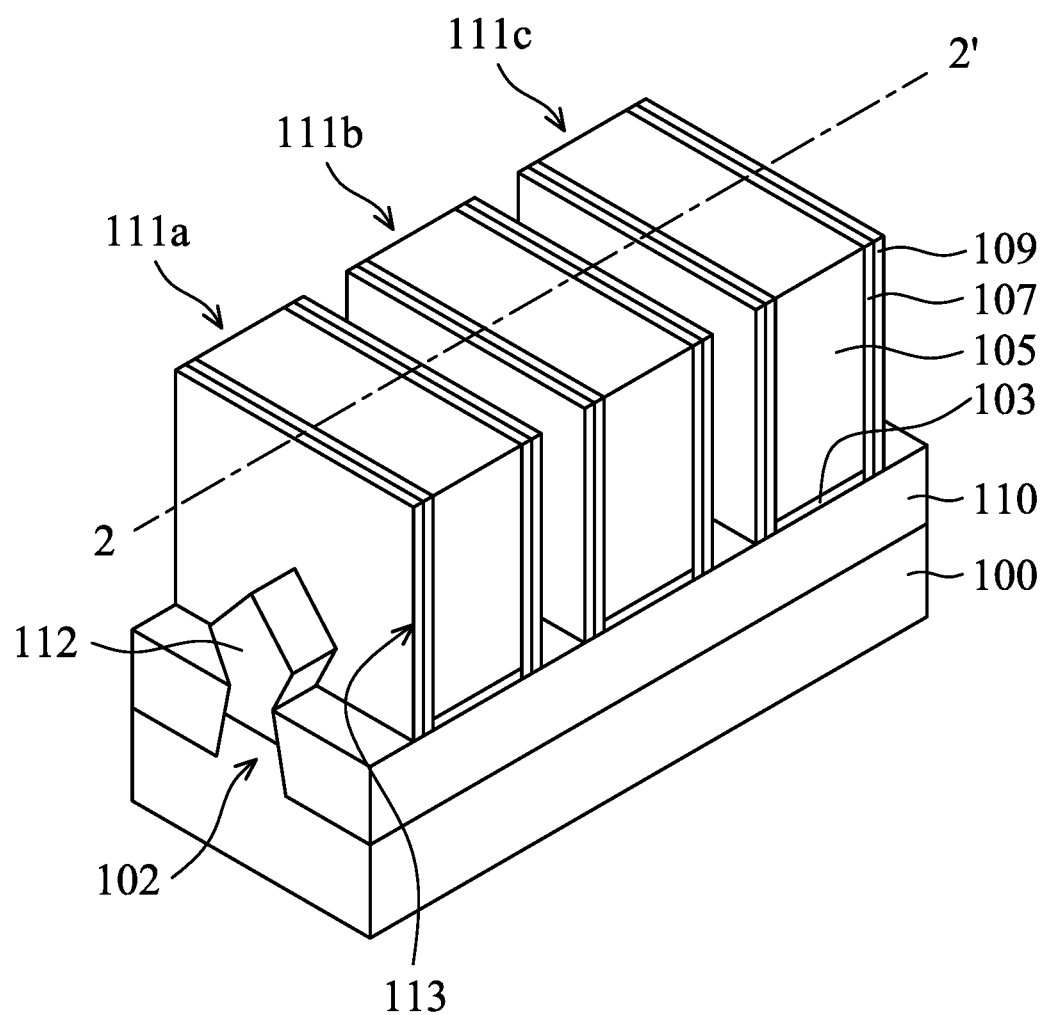
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a gate structure and an adjacent source/drain contact structure over a fin structure of the semiconductor substrate. The gate structure is covered with an insulating capping layer. An insulating layer is formed over the gate structure and the source/drain contact structure. Afterwards, the insulating layer is patterned to form a self-aligned via opening by multiple etching processes (which may be referred to as a multi-step etching process) using the capping layer as a hard mask, so that the source/drain contact structure is exposed. One of the multiple etching processes uses an etching gas mixture that includes an oxygen gas to recess the insulating layer directly above the source/drain contact structure. Afterwards, another etching process uses another etching gas mixture that includes a hydrogen gas to remove the remaining insulating layer directly above the source/drain contact structure, so that the source/drain contact structure is exposed.

The etching gas mixture including the oxygen gas can remove the polymer residue formed in the via opening during the recessing of the insulating layer to increase the etching rate, thereby reducing the process time. Moreover, the via opening profile can be improved due to the removal of the formed polymer residue, so as to maintaining the etching rate during the recessing of the insulating layer. In addition, the etching gas mixture including the hydrogen gas can prevent the source/drain contact structure from being damaged, such as corrosion or oxidation. Such etching gas mixtures provide a high etching selectivity between the insulating layer and the capping layer. As a result, the gate structure can be protected by the capping layer during the multiple etching processes. Therefore, a short circuit between the gate structure and the source/drain contact structure can be prevented even if the via opening overreaches from the position above the source/drain contact structure to the position above the gate structure.

Figure 1B:
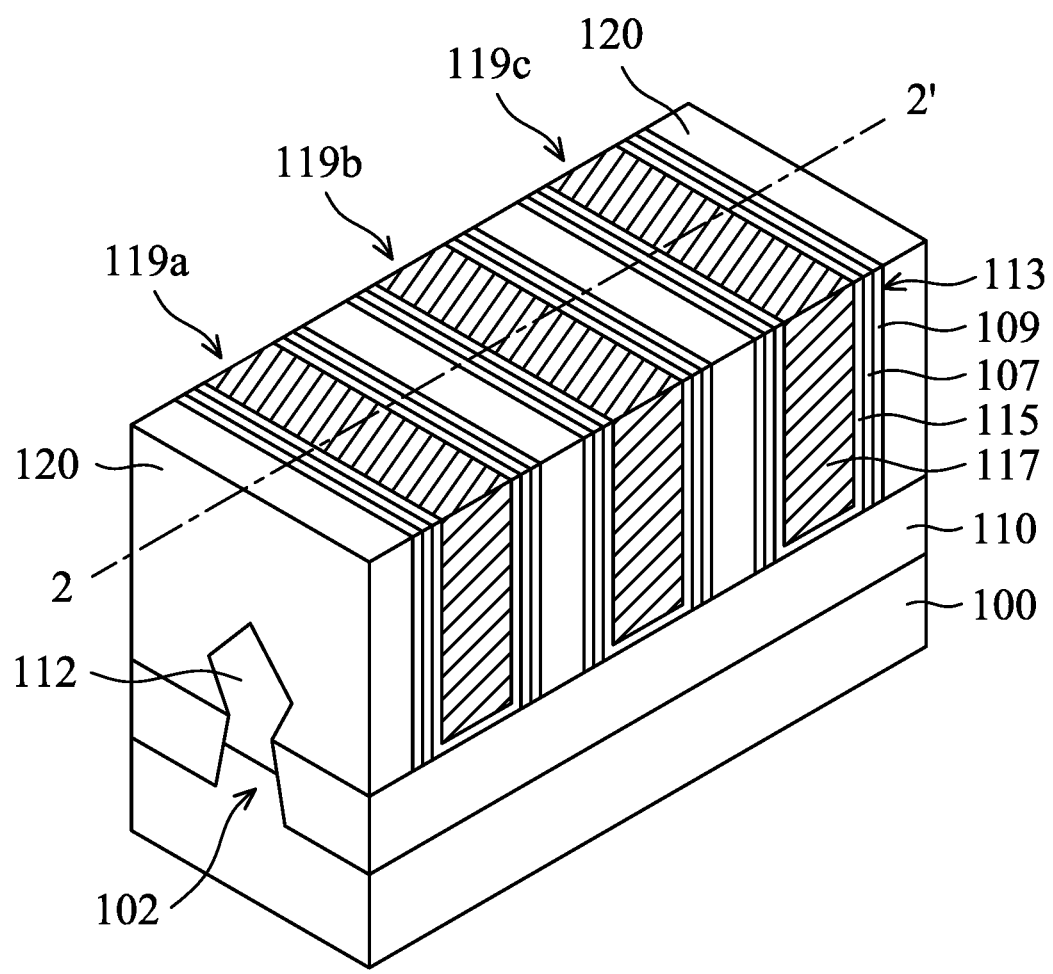
Figure 1C:
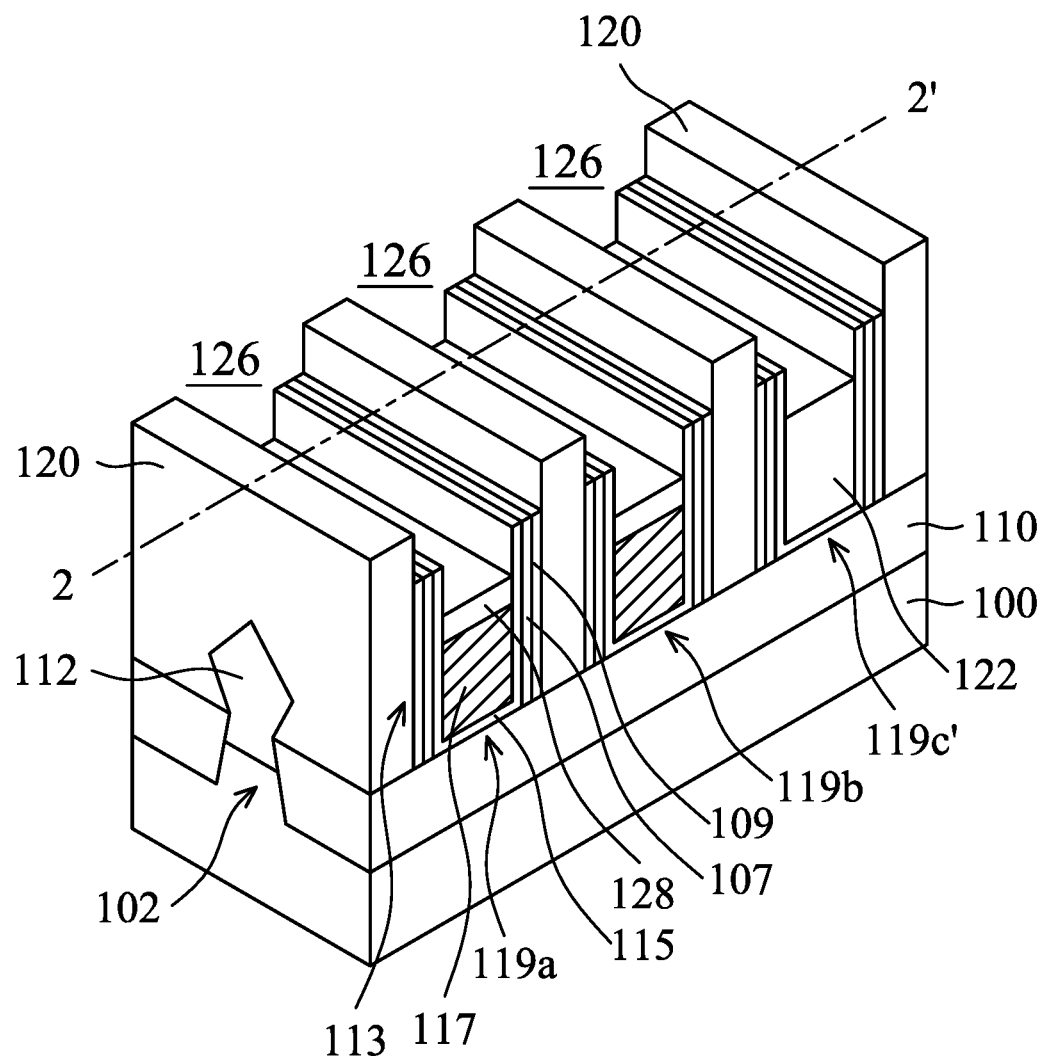
Figure 1D:
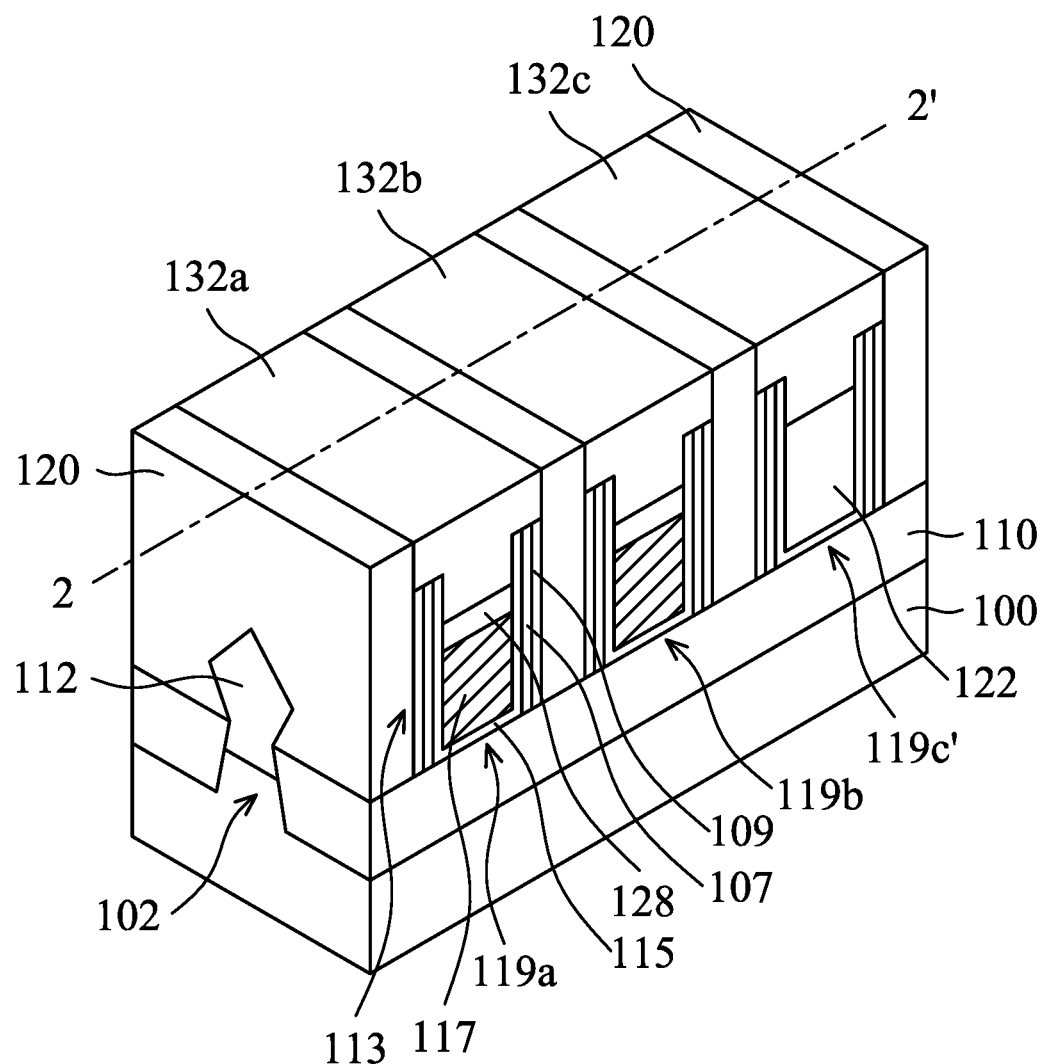
Figure 2A:
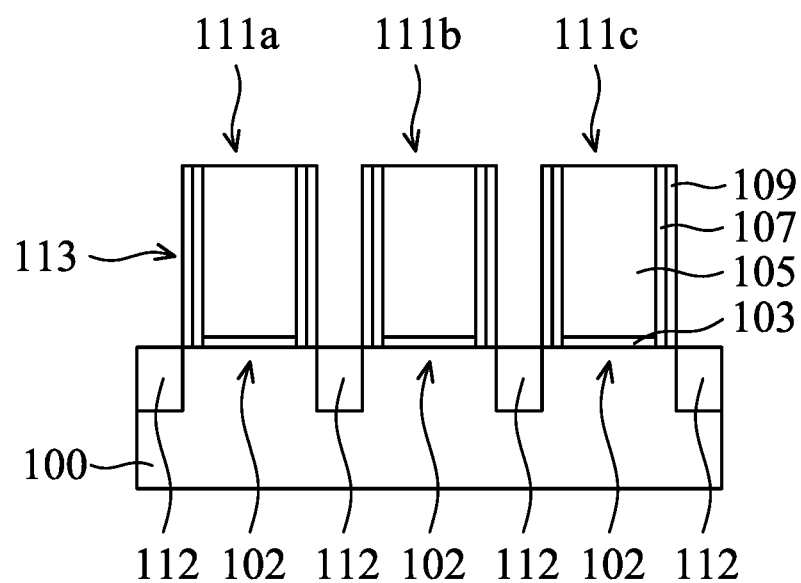
FIGS. 2A to 2Q illustrate cross-sectional representations of various stages of manufacturing the semiconductor device structure in accordance with some embodiments.
Figure 2B:
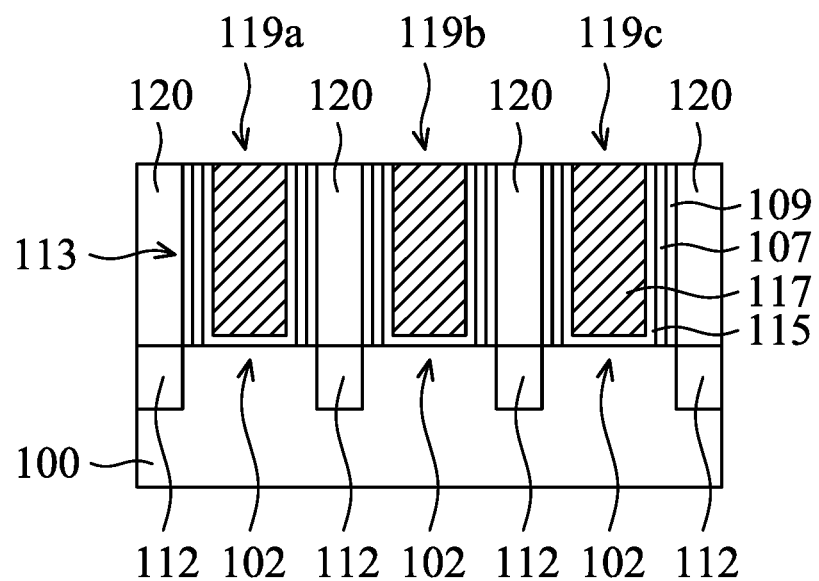
Figure 2C:
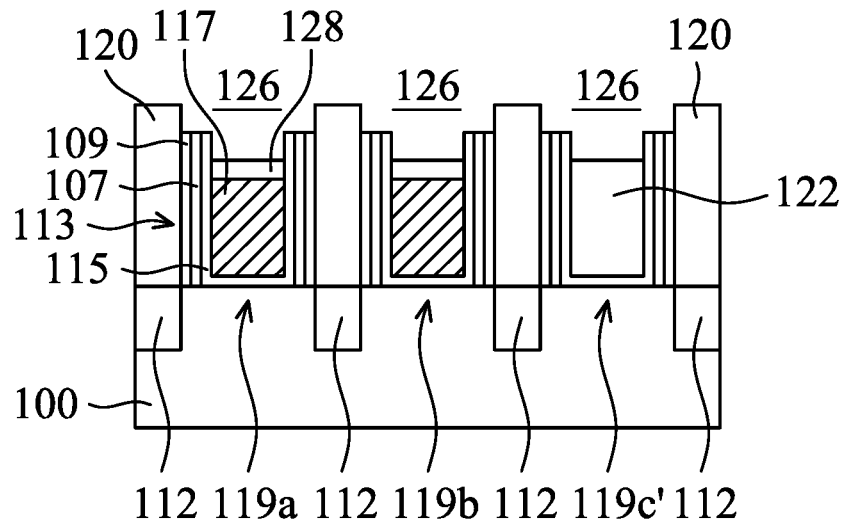
Figure 2D:
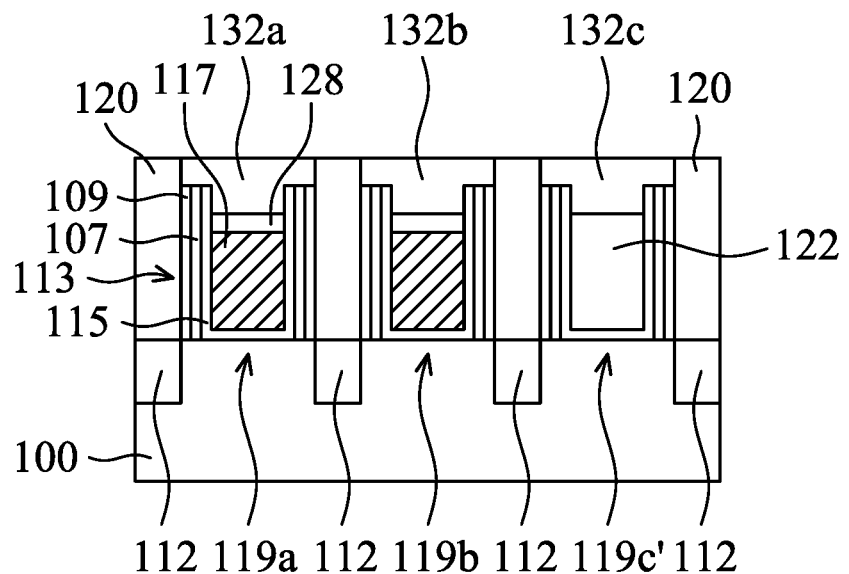
Figure 2E:
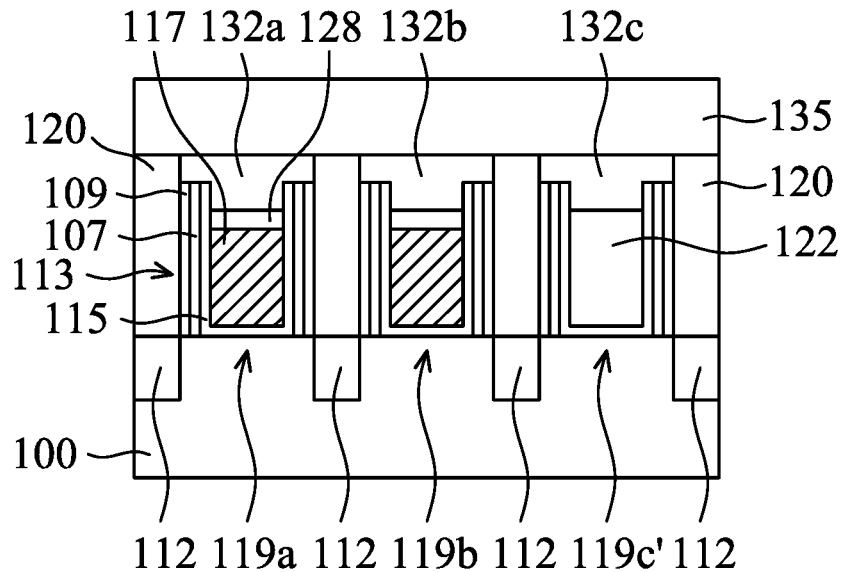
Figure 2F:
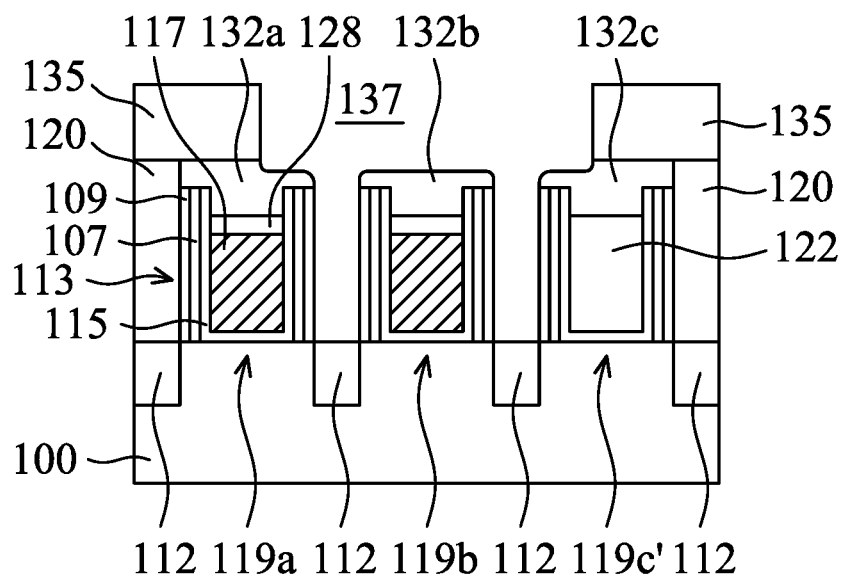
Figure 2G:
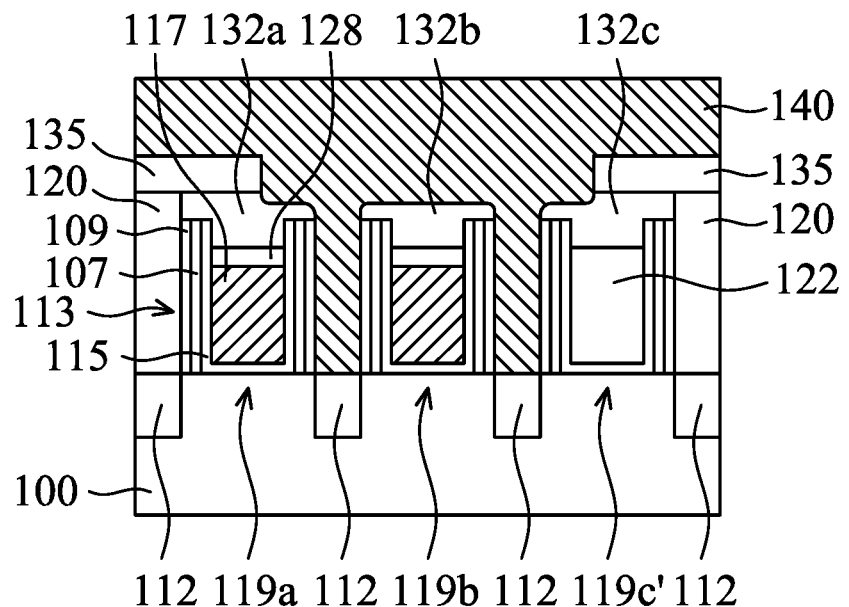
Figure 2H:
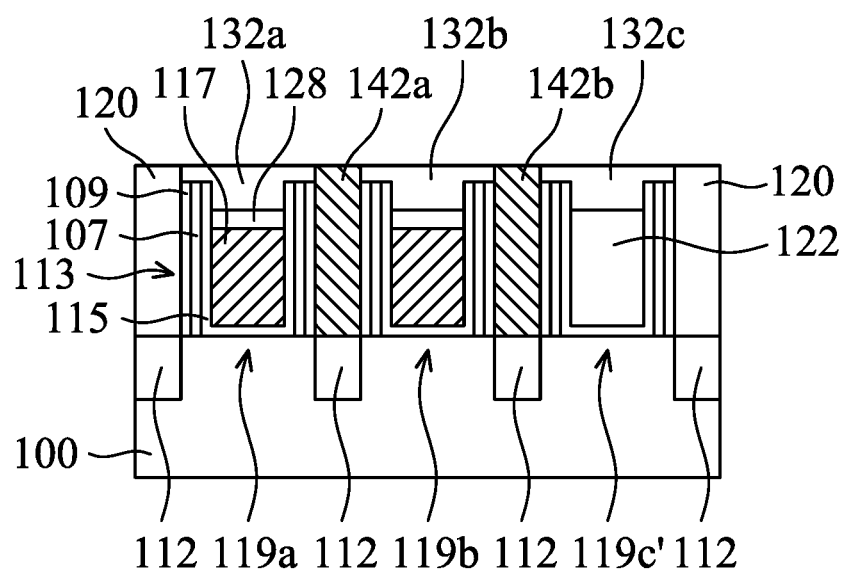
Figure 2I:
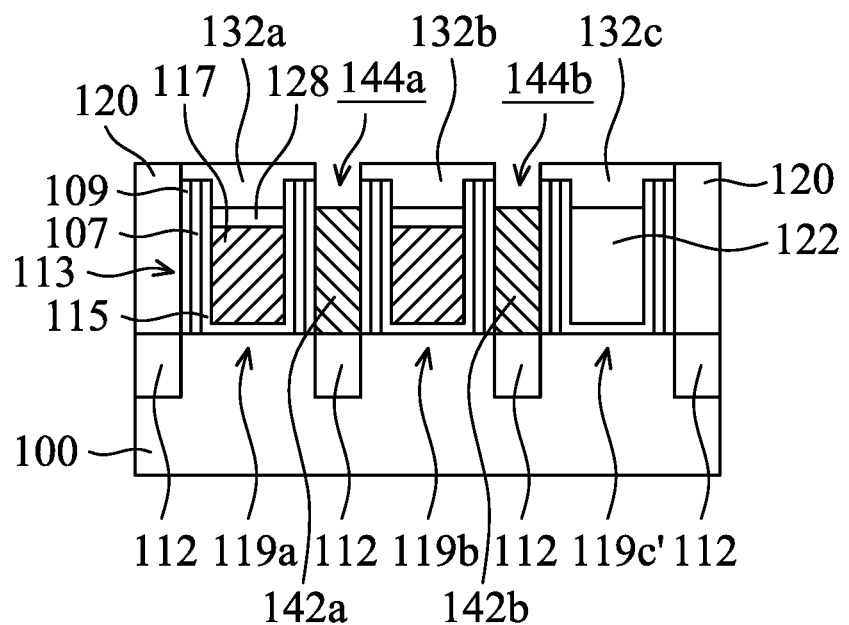
Figure 2J:
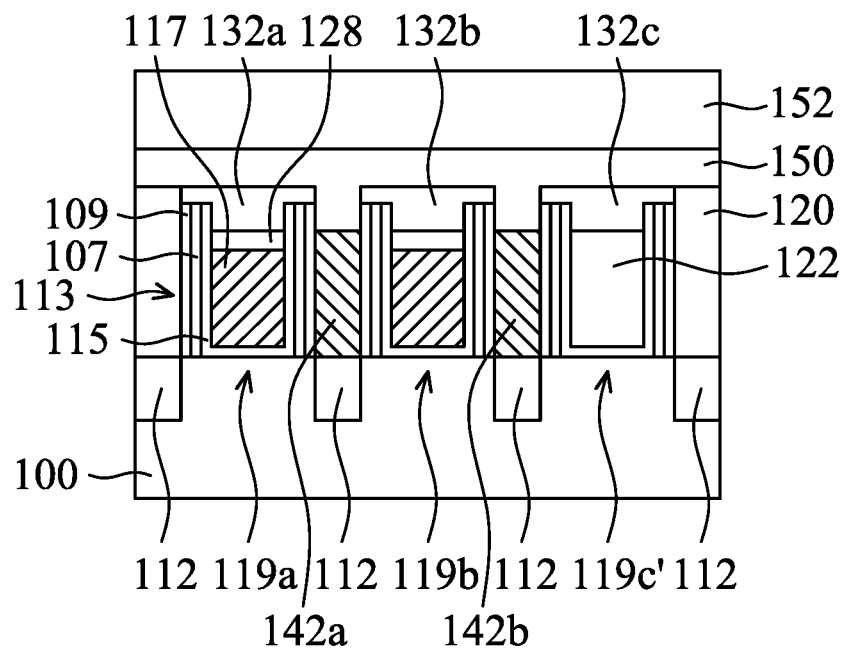
Figure 2K:
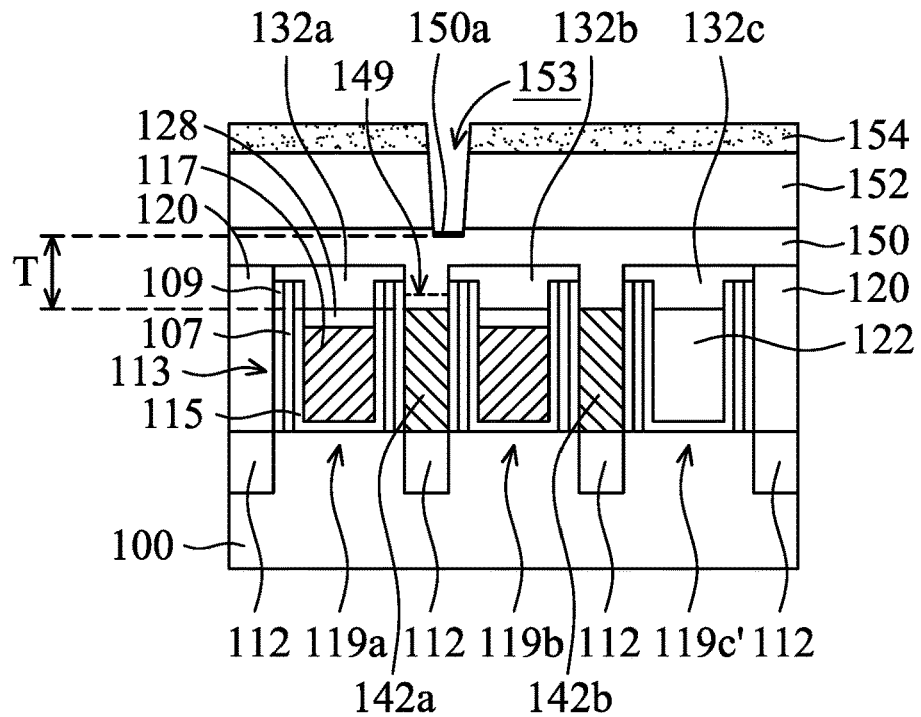
Figure 2L:
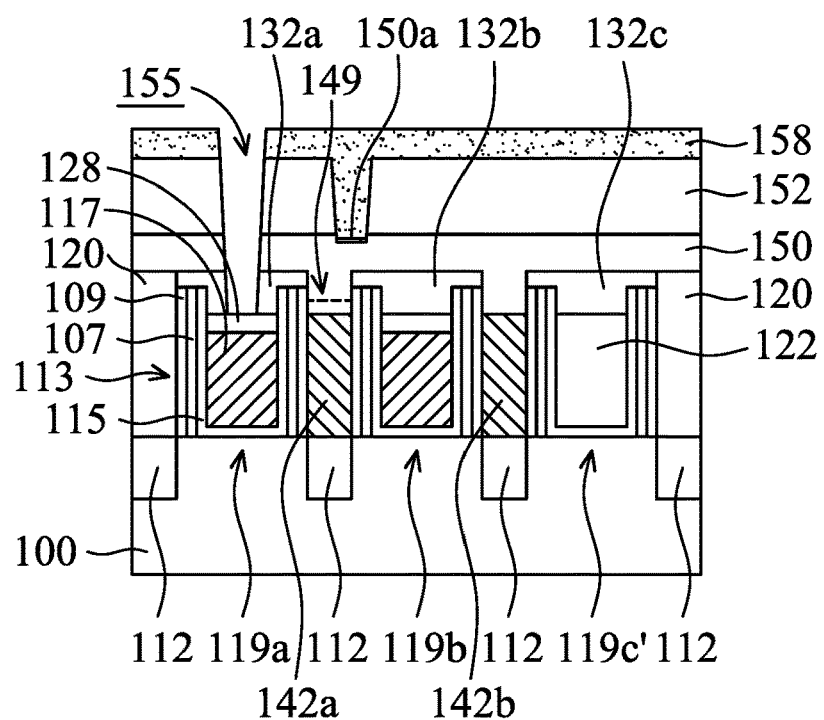
Figure 2M:
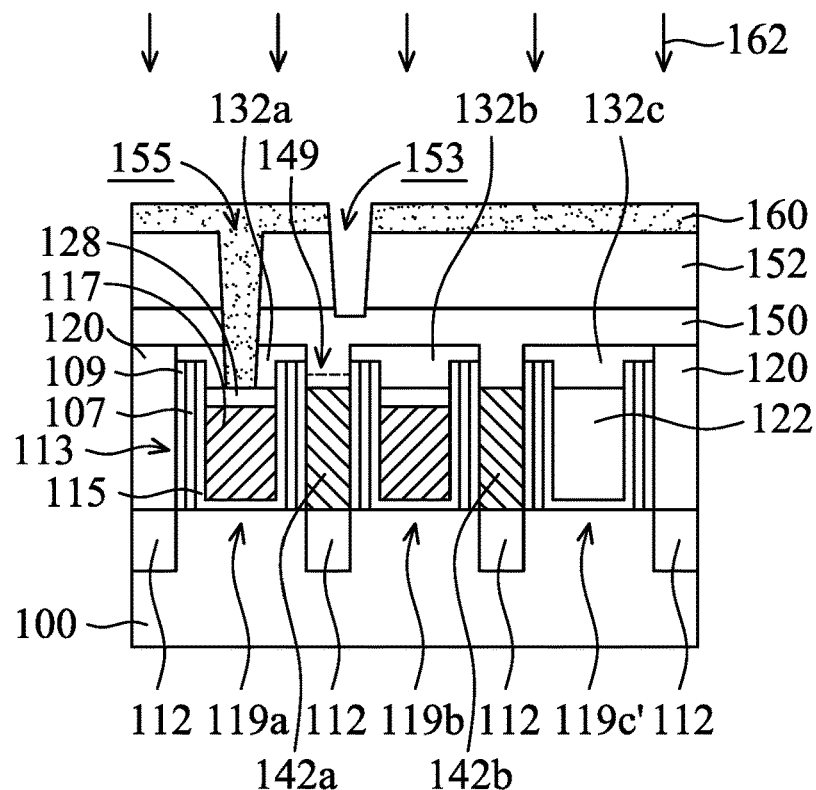
Figure 2N:
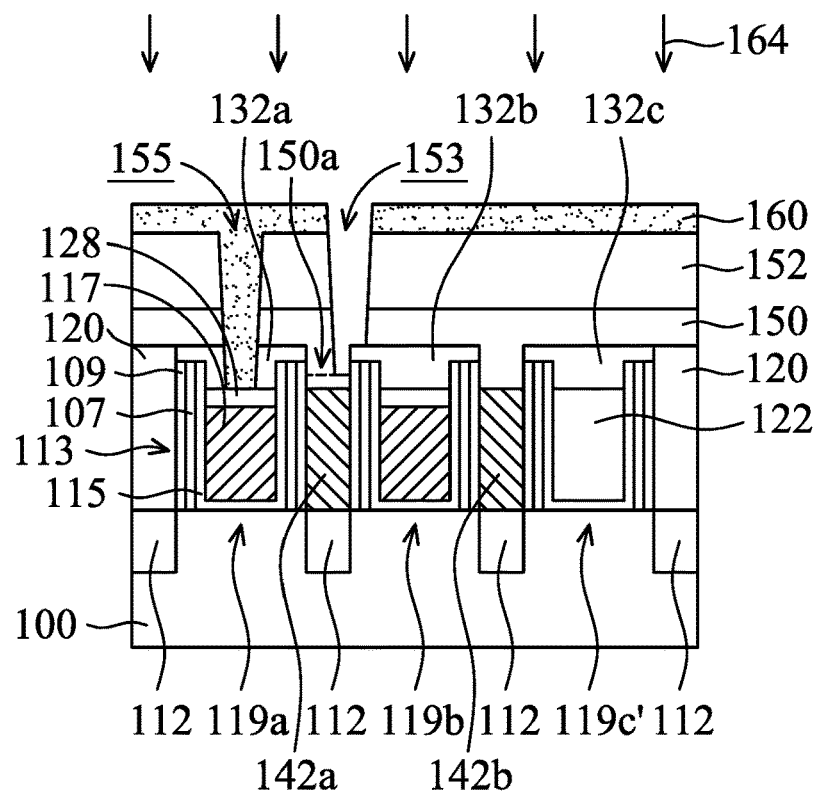
Figure 2O:
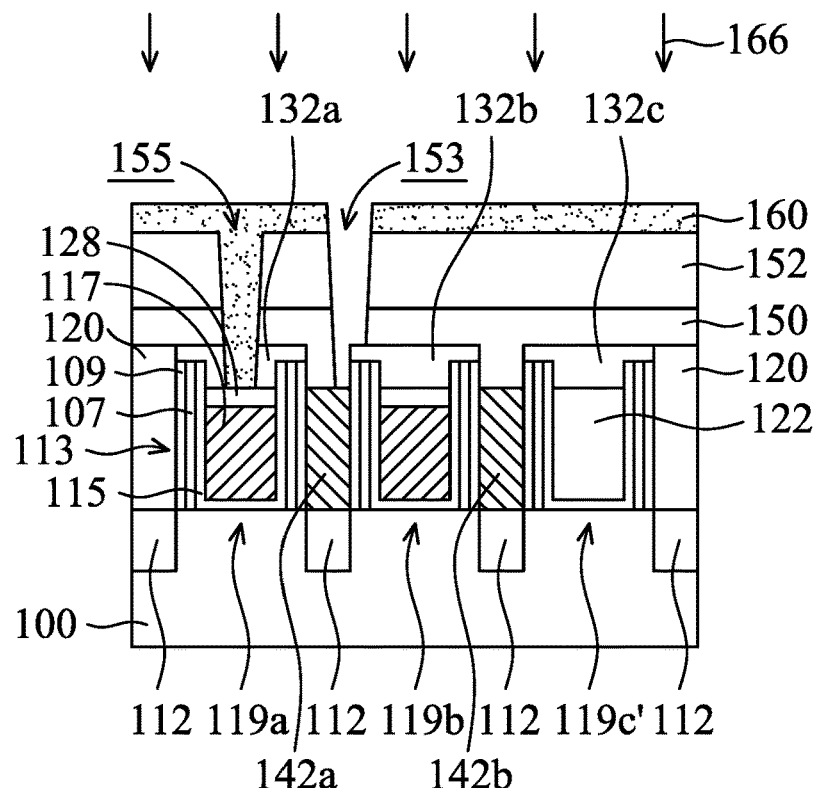
Figure 2P:
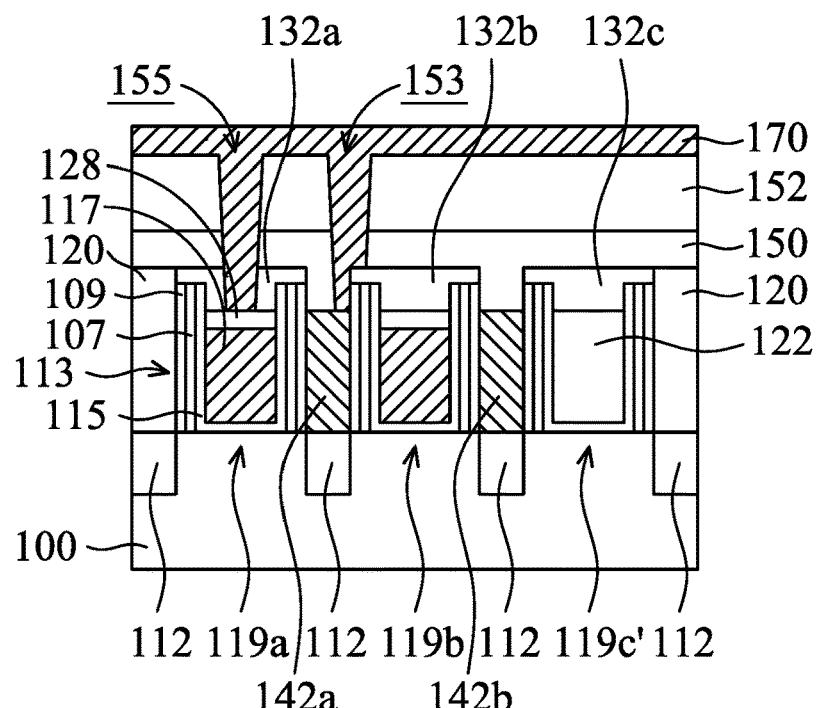
Figure 2Q:
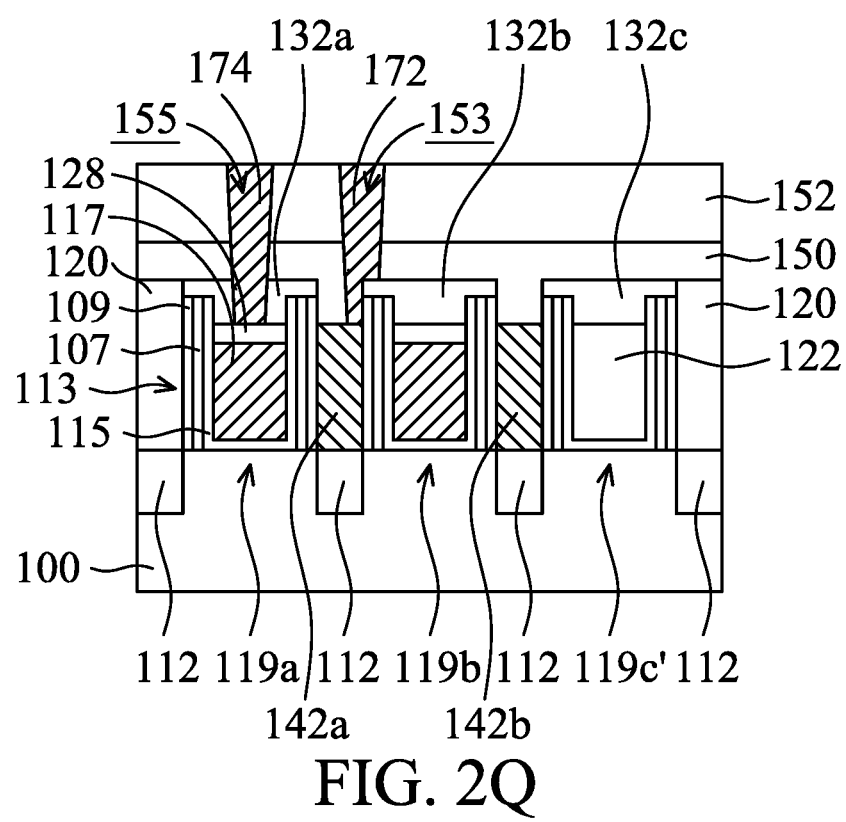

FIGS. 1A to 1D illustrate perspective views of various stages of manufacturing a semiconductor device structure and FIGS. 2A to 2Q illustrate cross-sectional representations of various stages of manufacturing a semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure.

As shown in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the SOI substrate is fabricated using a wafer bonding process, a silicon film transfer process, a separation by implantation of oxygen (SIMOX) process, another applicable method, or a combination thereof. In some embodiments, the substrate 100 is a silicon wafer. The substrate 100 may include silicon or another elementary semiconductor material such as germanium. In some other embodiments, the substrate 100 includes a compound semiconductor. The compound semiconductor may include gallium arsenide, silicon carbide, indium arsenide, indium phosphide, another suitable compound semiconductor, or a combination thereof.

Afterwards, multiple recesses (or trenches) are formed in the substrate 100 to successively form fin structures over the substrate 100, in accordance with some embodiments. As a result, multiple fin structures 102 are formed between the recesses. As shown in FIGS. 1A and 2A, one of the fin structures 102 is shown. In some embodiments, one or more photolithography and etching processes are used to form the fin structures 102 between the recesses.

Isolation features 110 are then formed in the recesses to surround lower portions of the fin structures 102, as shown in FIGS. 1A and 2A in accordance with some embodiments. The isolation features 110 are used to define and electrically isolate various device elements formed in and/or over the substrate 100. In some embodiments, the isolation features 110 include shallow trench isolation (STI) features, local oxidation of silicon (LOCOS) features, other suitable isolation features, or a combination thereof. The insulating layer for the formation of the isolation features 110 may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

Afterwards, dummy gate structures 111a, 111b, and 111c are formed across the fin structure 102 over the substrate 100 to cover the isolation features 110, as shown in FIGS. 1A and 2A in accordance with some embodiments. Each of the dummy gate structures 111a, 111b, and 111c includes a dummy gate dielectric layer 103 and a dummy gate electrode layer 105 formed over the dummy gate dielectric layer 103. The dummy gate dielectric layer 103 and the dummy gate electrode layer 105 may be made of silicon oxide and polysilicon, respectively.

Afterwards, gate spacers 113 are formed on the opposite sidewalls of the dummy gate structures 111a, 111b, and 111c, as shown in FIGS. 1A and 2A in accordance with some embodiments. Each of the gate spacers 113 includes a first spacer layer 107 covering the sidewall of the corresponding gate electrode layer 105 and a second spacer layer 109 covering the sidewall of the first spacer layer 107, as shown in FIGS. 1A and 2A in accordance with some embodiments.

In some embodiments, the first spacer layer 107 and the second spacer layer 109 are made of different materials. For example, the first spacer layer 107 may be made of a low-K dielectric materials or another applicable dielectric material. The second spacer layer 109 is made of silicon nitride, silicon carbide, silicon oxynitride, or another applicable material.

After formation of the gate spacers 113, source/drain structures 112 are formed in the fin structure 104 laterally adjacent to and exposed from the dummy gate structures 111a, 111b, and 111c, as shown in FIGS. 1A and 2A in accordance with some embodiments. In some embodiments, each of the source/drain structures 112 (which are referred to as source/drain regions) is formed by recessing the portions of the fin structure 102 laterally adjacent to the dummy gate structures 111a, 111b, and 111c and growing semiconductor materials in the formed recesses in the fin structure 102 by epitaxial (epi) growth processes. For example, the semiconductor device structure may be an NMOS device, and the source/drain structure 120 may include Si, SiP, SiC, SiPC, or an III-V group semiconductor material (such as InP, GaAs, AlAs, InAs, InAlAs, or InGaAs), or the like. Alternatively, the semiconductor device structure may be a PMOS device, and the source/drain feature 120 may include Si, SiGe, SiGeB, or an III-V group semiconductor material (such as InSb, GaSb, or InGaSb), or the like. The source/drain structures 112 protrude above the isolation feature 110, as shown in FIG. 1A.

After the source/drain structures 112 are formed, an insulating layer 120 is formed over the fin structure 102 of the substrate 100 to cover the isolation feature 110 and the source/drain structures 112, as shown in FIGS. 1B and 2B in accordance with some embodiments. The insulating layer 120 may serve as an interlayer dielectric (ILD) layer. In some embodiments, the insulating layer 120 is a single layer made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 120 is deposited using any suitable method, such as a chemical vapor deposition (CVD) process, a plasma enhanced CVD (PECVD) process, flowable CVD (FCVD) process, the like, or a combination thereof.

Afterwards, the adjacent dummy gate structures 111a, 111b, and 111c are removed and replaced by gate structures 119a, 119b, and 119c, as shown in FIGS. 1B and 2B in accordance with some embodiments. In some embodiments, each of the gate structures 119a, 119b, and 119c includes a gate dielectric layer 115, a gate electrode layer 117, and the gate spacers 113.

The gate dielectric layer 115 may be made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate electrode layer 117 is made of a conductive material, such as copper, tungsten, aluminum, titanium, tantalum, or another applicable material.

Each of the gate structures 119a, 119b, and 119c may further include a work functional metal layer (not shown) between the gate dielectric layer 115 and the gate electrode layer 117. The work function metal layer may be made of TiN, TaN, Ru, Mo, Al, WN, ZrSi$_2$, MoSi$_2$, TaSi$_2$, NiSi$_2$, WN, or a combination thereof. Alternatively, the work function metal layer may be made of Ti, Ag, TaAl, TaAlC, TiAlN, TaC, TaCN, TaSiN, Mn, Zr, or a combination thereof.

Afterwards, the gate structures 119a, 119b, and 119c is recessed to form recessing openings 126, as shown in FIGS. 1C and 2C in accordance with some embodiments. During the formation of the recessing openings 126, portions of the gate dielectric layers 115 and the gate spacers 113 are also etched, so that upper sidewalls of the insulating layer 120 are exposed by the recessing openings 126. In some embodiments, each of the gate electrode layers 117 in gate structures 119a, 119b, and 119c is further etched after the upper sidewalls of the insulating layer 120 are exposed, so that the recessing openings 126 are extended to form a T-shaped profile, as shown in FIGS. 1C and 2C. As a result, the upper surface of each gate spacer 113 and the upper surface of each gate dielectric layer 115 are higher than the upper surface of the corresponding gate electrode layer 117.

Afterwards, each of the recessed gate electrode layers 117 is capped with a conductive layer 128, in accordance with some embodiments. The conductive layers 128 and the underlying gate electrode layer 117 form gate stacks of the gate structures 119a, 119b, and 119c. In some embodiments, the upper surface of each gate spacer 113 is higher than the upper surface of each gate stack, as shown in FIGS. 1C and 2C. The conductive layers 128 protect the gate electrode layers 117 from damage or loss during subsequent processing. The conductive layers 128 may be made of a metal material, such as tungsten or fluorine-free tungsten.

After the conductive layers 128 are formed, a gate cut process is performed to remove one or more gate stacks of the gate structures 119a, 119b, and 119c in accordance with some embodiments. For example, the gate stack of the gate structure 119c may be removed by etching during the gate cut process. Afterwards, an insulating material 122 fills the space that is formed by the removal of the gate stack of the gate structure 119c to form an insulating gate-cut structure 119c', as shown in FIGS. 1C and 2C in accordance with some embodiments. The insulating gate-cut structure 119c' includes the gate dielectric layer 115, the insulating material 122, and gate spacers 113 including the first spacer layers 107 and the second spacer layers 109.

The insulating material 122 may include silicon nitride, silicon oxynitride, or silicon carbon nitride, or the like. Alternatively, the insulating material 122 may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material.

Afterwards, insulating capping layers 132a, 132b, and 132c are formed in the recessing openings 126 (not shown and as indicated in FIGS. 1C and 2C) to respectively cover the upper surfaces of the gate structures 119a and 119b, and the insulating gate-cut structure 119c', as shown in FIGS. 1D and 2D in accordance with some embodiments. In some embodiments, an insulating layer (not shown) used for formation of the insulating capping layers 132a, 132b, and 132c is formed over the structure shown in FIGS. 1C and 2C and fills the recessing openings 126. For example, the insulating layer is made of a material that is different from the material of the insulating layer 120 and includes a metal oxide, such as $ZrO_2$, $SiO_2$, $Ta_2O_5$, $Al_2O_3$, or $WO_x$. The insulating layer may be formed by performing a chemical vapor deposition (CVD) process, a plasma enhanced CVD (PECVD) process, low-pressure CVD (LPCVD) process, an atomic layer deposition (ALD) process, or another applicable process.

Afterwards, a polishing process, such as a chemical mechanical polishing (CMP) process, is performed to remove the excess insulating layer above the insulating layer 120. As a result, the remaining insulating layer forms insulating capping layers 132a, 132b, and 132c, and the upper surfaces of the insulating capping layers 132a, 132b, and 132c are substantially level with the upper surface of the insulating layer 120, as shown in FIGS. 1D and 2D. The insulating capping layers 132a and 132b may serve as etch masks and protect the gate structures 119a and 119b in the subsequent manufacturing processes (e.g., etching processes).

After the insulating capping layers 132a, 132b, and 132c are formed, a masking layer 135 is formed over the insulating layer 120 and the insulating capping layers 132a, 132b, and 132c, as shown in FIG. 2E in accordance with some embodiments. In some embodiments, the masking layer 135 includes oxide-nitride-oxide (ONO) layers. In some other embodiments, the masking layer 135 includes a tri-layer structure including a bottom layer, a middle layer, and a top layer. In order to simplify the diagram, only a flat layer is depicted. The bottom layer may contain a material that is patternable and/or have anti-reflection properties. For example, the bottom layer may be a bottom anti-reflective coating (BARC) layer, such as a nitrogen-free anti-reflective coating (NFARC) layer. The bottom layer may be formed by a spin-on coating process, a chemical vapor deposition (CVD) process, a physical vapor deposition (PVD) process, or another suitable deposition process. The middle layer formed over the bottom layer is a second layer of the tri-layer structure. The middle layer provides hard mask properties for the photolithography process. In addition, the middle layer is designed to provide etching selectivity from the bottom layer and the top layer. The middle layer may be made of silicon nitride, silicon oxynitride or silicon oxide and formed by a spin-on coating process, a chemical vapor deposition (CVD) process, a physical vapor deposition (PVD) process, or another suitable deposition process. The top layer is formed over the middle layer and is a third layer of the tri-layer structure. The top layer may be positive photoresist or negative photoresist.

Afterwards, an opening 137 is formed through the masking layer 135 and the insulating layer 120 to expose the upper surfaces of some source/drain structures 112 between the gate structures 119a and 119b and between the gate structure 119b and the insulating gate-cut structure 119c', as shown in FIG. 2F in accordance with some embodiments. In some embodiments, the opening 137 is formed by patterning the masking layer 135 and removing the insulating layer 120 using the patterned masking layer 135 as an etch mask.

During the removal of the insulating layer 120, the insulating capping layers 132a, 132b, and 132c are also used as etch masks, so as to define source/drain contact regions between the gate structures. For example, the source/drain contact regions are between the gate structures 119a and 119b and between the gate structure 119b and the insulating gate-cut structure 119c'. A portion of the masking layer 135 and portions of the insulating capping layers 132a, 132b, and 132c are also be removed during the etching for formation of the opening 137. However, the gate structures 119a, 119b, and the insulating gate-cut structure 119c' still can be protected by the insulating capping layers 132a, 132b, and 132c.

Afterward, a conductive material 140 is formed over the patterned masking layer 135 and fills the opening 137, as shown in FIG. 2G in accordance with some embodiments. In some embodiments, the conductive material 140 is made of Co, Cu, W, Ni, Al, Mo, or the like. The conductive material 140 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

The excess conductive material 140A is removed by a polishing process, as shown in FIG. 2H in accordance with some embodiments. In some embodiments, the polishing process, such as chemical mechanical polishing (CMP) process, is performed on the conductive material 140 until the insulating capping layers 132a, 132b, and 132c are exposed and planarized. The remaining conductive material 140 forms a contact structure 142a between and laterally adjacent to the gate structures 119a and 119b, and a contact structure 142b between and laterally adjacent to the gate structure 130b and the insulating gate-cut structure 119c'. Those contact structures 142a and 142b electrically connect the corresponding source/drain structures 112 and therefore they are also referred to as self-aligned source/drain contact structures or self-aligned source/drain electrodes.

Afterwards, the masking layer 135 is removed. The contact structures 142a and 142b are recessed to form recess openings 144a and 144b above the contact structures 142a and 142b, respectively, as shown in FIG. 2I in accordance with some embodiments. In some embodiments, after the contact structures 142a and 142b are recessed, the recess opening 144a is formed between the gate structures 119a and 119b, and a recess 144b is formed between the gate structure 119b and the insulating gate-cut structure 119c'. As a result, the upper surfaces of contact structure 142a and the contact structure 142b are lower than the upper surfaces of the insulating capping layer 132a, 132b, and 132c. In some embodiments, the upper surfaces of the insulating capping layer 132a, 132b, and 132c are substantially level with the upper surfaces of the conductive layers 128 in the gate structures 119a and 119b, as shown in FIG. 2I.

After the contact structures 142a and 142b are recessed, insulating layers 150 and 152 are successively formed over the insulating layer 120 and cover the insulating capping layers 132a, 132b, and 132c, as shown in FIG. 2J in accordance with some embodiments. In some embodiments, the insulating layer 150 fills the recess openings 144a and 144b (not shown and as indicated in FIG. 2I) and serves as an etch stop layer for the subsequent etching of the insulating layer 152. The insulating layer 150 is made of a material that is different from the material of the insulating capping layers 132a, 132b, and 132c. For example, the insulating layer 150 may be made of silicon nitride. Alternatively, the insulating layer 150 may be made of SiCN, SiOC, SiON, SiCN, or SiOCN. The insulating layer 150 may be formed by performing a chemical vapor deposition (CVD) process, a plasma enhanced CVD (PECVD) process, low pressure CVD (LPCVD) process, an atomic layer deposition (ALD) process, or another applicable processes.

In some embodiments, the insulating layer 152 serves as an interlayer dielectric (ILD) layer and is made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 152 may be formed by performing by any suitable deposition method, such as a chemical vapor deposition (CVD) process, a plasma enhanced CVD (PECVD) process, flowable CVD (FCVD) process, physical vapor deposition, (PVD), atomic layer deposition (ALD), spin-on coating, the like, or a combination thereof.

After the insulating layer 152 is formed, a via opening 153 that passes through the insulating layer 152 is formed, as shown in FIG. 2K in accordance with some embodiments. In some embodiments, the insulating layer 152 is patterned by an etching process using a patterned masking layer 154 as an etch mask, so as to form the via opening 153 and expose the insulating layer 150 directly above the source/drain contact structure 142a. The patterned masking layer 154 may be made of a photoresist material and formed by a photolithography process. In some embodiments, the formed via opening 153 is also directly above a portion of the adjacent insulating capping layer (e.g., the insulating capping layer 132b) due to the photo overlay shift during the formation of the patterned masking layer 154, as shown in FIG. 2K. In some embodiments, since a portion of the exposed surface of the insulating layer 150 is slightly etched during patterning the insulating layer 152, the formed via opening 153 has a bottom lower than a top of the portion of the insulating layer 150 without being exposed from the via opening 153.

In some embodiments, a native oxide layer 150a is formed on the second portion of the remaining insulating layer 150 (i.e., the exposed surface of the insulating layer 150 at the bottom of the via opening 153) after the formation of via opening 153. The top of the native oxide layer 150a may be higher or lower than the top of the portion of the insulating layer 150 without being exposed from the via opening 153.

In some embodiments, the remaining insulating layer 150 below the via opening 153 and in the recess opening 144a (not shown and as indicated in FIG. 2I) has a first portion (i.e., a portion of the remaining insulating layer 150 below the dashed line 149) and a second portion (i.e., a portion of the remaining insulating layer 150 above the dashed line 149). The first portion is adjacent to the contact structure 142a and the second portion extends from a top (i.e., the dashed line 149) of the first portion.

In some embodiments, the thickness T of the remaining insulating layer 150 measured from the top of the contact structure 142a to the bottom of the native oxide layer 150a is in a range of from about 20 nm to about 30 nm. Moreover, the first portion of the insulating layer 150 has a thickness that occupies 30%-50% of the thickness T of the remaining insulating layer 150 and the second portion of the insulating layer 150 has a thickness that occupies 50%-70% of the thickness T of the remaining insulating layer 150.

After formation of the via opening 153 and the native oxide layer 150a, the patterned masking layer 154 is removed from the insulating layer 152 and is replaced by a patterned masking layer 158, as shown in FIG. 2L in accordance with some embodiments. In some embodiments, the patterned masking layer 158 is formed over the insulating layer 152 and fills the via opening 153. In some embodiments, the patterned masking layer 158 is made of a material that is the same as or similar to the patterned masking layer 154 and formed by a photolithography process. Afterwards, in some embodiments, one or more etching processes may be performed to etch the insulating layers 152 and 150 and the insulating capping layer 132a, so as to form a via opening 155 therein and expose the upper surface of the gate structure 119a (e.g., the upper surface of the conductive layer 128 in the gate structure 119a), as shown in FIG. 2L.

After formation of the via opening 155, the via opening 153 is extended along a downward direction by multiple etching processes (which may be referred to as a multi-step etching process) to expose the contact structure 142a, as shown in FIGS. 2M to 2O in accordance with some embodiments. As shown in FIG. 2M, the native oxide layer 150a near the bottom of the via opening 153 and on the second portion of the insulating layer 150 is removed by an etching process 162 (which is also referred to as a first step of the multi-step etching process). Afterwards, the via opening 153 is extended in a downward direction by the removal of the second portion of the insulating layer 150 using an etching process 164 (which is also referred to as a second step of the multi-step etching process). Afterwards, the via opening 153 is further extended in a downward direction by the removal of the first portion of the insulating layer 150 using an etching process 166 (which is also referred to as a third step of the multi-step etching process). As a result, the contact structure 142a is exposed from the extended via opening 153.

More specifically, the patterned masking layer 158 is removed from the insulating layer 152 and is replaced by a patterned masking layer 160, as shown in FIG. 2M in accordance with some embodiments. The patterned masking layer 160 is formed over the insulating layer 152, fills the via opening 155 and expose the via opening 153. In some embodiments, the patterned masking layer 160 is made of a material that is the same as or similar to the patterned masking layer 154 and formed by a photolithography process.

Afterwards, in some embodiments, the top of the insulating layer 150 exposed from the via opening 153 is cleaned to remove the native oxide layer 150a, as shown in FIG. 2M. In some embodiments, the exposed insulating layer 150 below the via opening 153 is cleaned by the etching process 162 using the patterned masking layer 160 as an etch mask. The removal of the native oxide layer 150a may be advantageous to facilitate the subsequent etching process or etching step for the removal of the insulating layer 150. As a result, the total etching process time can be reduced or the occurrence of etching stop can be prevented.

In some embodiments, the etching process 162 (e.g., a dry etching process) includes exposing the native oxide layer 150a to a plasma ignited from a treatment gas. The treatment gas includes a fluorine-containing gas. The fluorine-containing gas may include $CF_4$, $C_4F_6$, $C_4F_8$, or the like or a combination thereof. In some embodiments, the etching process 162 is performed in a processing chamber (such as a capacitively coupled plasma (CCP) chamber) with the treatment gas being supplied into the processing chamber. In some embodiments, carrier gases, such as argon, helium, xenon, nitrogen, or the like, are employed to carry the treatment gas into the processing chamber. A flow rate of the fluorine-containing gas in the treatment gas during the etching process 162 is in a range from about 100 sccm to about 300 sccm. Moreover, the etching process 162 may be performed with a high frequency (e.g., 40 MHz) bias power in a range from about 200 W to about 400 W and with a low frequency (e.g., 13 MHz) bias power in a range from about 30 W to about 50 W. The etching process 162 may be performed for a duration in a range from about 3 seconds to about 15 seconds. The short duration may avoid the plasma ignited from the fluorine-containing gas (e.g., $CF_4$ gas) interacts with the insulating capping layer 142b that is covered by a portion of the insulating layer 150. Therefore, the loss of the insulating capping layer 142b can be prevented or mitigated.

After the removal of the native oxide layer 150a, the exposed insulating layer 150 below the via opening 153 is recessed or partially etched to remove the second portion of the insulating layer 150 and leave the first portion of the insulating layer 150, as shown in FIG. 2N in accordance with some embodiments. In some embodiments, the second portion of the insulating layer 150 below the via opening 153 is removed by the etching process 164 (which is also referred to as a main etching process or a main etching step) using the patterned masking layer 160 as an etch mask.

In some embodiments, the etching process 164 (e.g., a dry etching process) includes exposing the second portion of the insulating layer 150 to a plasma ignited from an etching gas mixture. The etching gas mixture includes an oxygen gas and a fluorine-containing gas that is different from the fluorine-containing gas used in the etching process 162. The fluorine-containing gas may include $CHF_3$, $CH_2F_2$, or the like or a combination thereof. In some embodiments, the etching process 164 may be an in-situ etching process that is performed in the same processing chamber as that used in the etching process 162 with the etching gas mixture being supplied into the processing chamber. In some embodiments, carrier gases, such as argon, helium, xenon, nitrogen, or the like, are employed to carry the etching gas mixture into the processing chamber. A flow rate of the oxygen gas in the etching gas mixture during the etching process 164 is in a range from about 10 sccm to about 100 sccm. A flow rate of the fluorine-containing gas in the etching gas mixture during the etching process 164 is in a range from about 100 sccm to about 200 sccm. Moreover, the etching process 164 may be performed with a high frequency (e.g., 40 MHz) bias power in a range from about 200 W to about 400 W and with a low frequency (e.g., 13 MHz) bias power in a range from about 50 W to about 200 W. The etching process 164 may be performed for a duration that is longer than the duration of the etching process 162 and is in a range from about 20 seconds to about 60 seconds.

During the etching process 164, polymer residue (such as fluorocarbon ($CF_x$) or hydrofluoric carbon (HFC)) may be formed on the sidewall of the via opening 153 due to the use of the fluorine-containing gas. The formed polymer residue may reduce the etching rate of the etching process and cause the formed via opening 153 having an undesired tapered sidewall profile. However, the use of the oxygen gas in the etching process 164 can effectively remove the formed polymer residue, so as to increase the etching rate of the etching process 164 and improve the via opening (i.e., the via opening 153) profile, thereby reducing the process time for the removal of the insulating layer 150 below the via opening 153.

In addition, as shown in FIG. 2N, a portion of the insulating capping layer 132b is exposed on the plasma during the etching process 164. Such an etching gas mixture provides a high etching selectivity between the insulating layer 150 and the insulating capping layer 132b. As a result, the loss of the insulating capping layer 142b can also be prevented or mitigated. Therefore, the insulating capping layer 132b can serve as a hard mask or an etching stop layer during the etching process 164 to protect the gate structure 119b. Therefore, a short circuit between the gate structure 119b and the contact structure 142a can be prevented although the via opening 153 overreaches from the position above the contact structure 142a to the position above the gate structure 119b.

After the insulating layer 150 is partially removed, the left insulating layer 150 below the via opening 153 is etched to remove the first portion of the insulating layer 150, as shown in FIG. 2O in accordance with some embodiments. In some embodiments, the first portion of the insulating layer 150 below the via opening 153 is removed by the etching process 166 (which is also referred to as an overetching process or an overetching step) using the patterned masking layer 160 as an etch mask, so as to expose the contact structure 142a.

In some embodiments, the etching process 166 (e.g., a dry etching process) includes exposing the first portion of the insulating layer 150 to a plasma ignited from an etching gas mixture. Unlike the etching gas mixture used in the etching process 164, the etching gas mixture is free of oxygen and includes a hydrogen gas and a fluorine-containing gas that is the same as or similar to the fluorine-containing gas used in the etching process 164. For example, the fluorine-containing gas may include $CHF_3$, $CH_2F_2$, or the like or a combination thereof. In some embodiments, the etching process 166 may be an in-situ etching process that is performed in the same processing chamber as that used in the etching process 164 with the etching gas mixture being supplied into the processing chamber. In some embodiments, carrier gases, such as argon, helium, xenon, nitrogen, or the like, are employed to carry the etching gas mixture into the processing chamber. A flow rate of the hydrogen gas in the etching gas mixture during the etching process 166 is in a range from about 50 sccm to about 150 sccm. A flow rate of the fluorine-containing gas in the etching gas mixture during the etching process 166 is less than the fluorine-containing gas in the etching gas mixture during the etching process 164 and is in a range from about 5 sccm to about 30 sccm. Moreover, the etching process 166 may be performed with a high frequency (e.g., 40 MHz) bias power in a range from about 200 W to about 400 W and with a low frequency (e.g., 13 MHz) bias power in a range from about 50 W to about 150 W. The etching process 166 may be performed for a duration that is longer than the duration of the etching process 164 and is in a range from about 60 seconds to about 120 seconds.

Since polymer residue may also be formed on the sidewall of the via opening 153 during the etching process 166 due to the use of the fluorine-containing gas, a low flow rate of the fluorine-containing gas is used compared to the flow rate of the fluorine-containing gas used in the etching process 164, thereby mitigating the formation of polymer residue. Moreover, the reduction of the etching rate of the etching process 166 can increase the overetching process window.

In addition, the hydrogen gas is provided for defluorination in the etching process 166, so as to prevent the contact structure 142a from being damaged, such as corrosion or oxidation.

Similarly, as shown in FIG. 2O, such an etching gas mixture also provides a high etching selectivity between the insulating layer 150 and the exposed portion of the insulating capping layer 132b. As a result, the insulating capping layer 132b can serve as a hard mask or an etching stop layer during the etching process 166 to protect the gate structure 119b. Therefore, a short circuit between the gate structure 119b and the contact structure 142a can be prevented although the via opening 153 overreaches from the position above the contact structure 142a to the position above the gate structure 119b.

After the via opening 153 is extended to expose the contact structure 142a, the patterned masking layer 160 is removed from the insulating layer 152 and the via opening 155, and a conductive material 170 is formed over the insulating layer 152 and fills the via openings 153 and 155, as shown in FIG. 2P in accordance with some embodiments. In some embodiments, the conductive material 170 is made of Co, Cu, W, Ni, Al, Mo, or the like. The conductive material 170 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

After the conductive material 170 is formed, a polishing process is performed on the conductive material 170 until the upper surface of the insulating layer 152 is exposed, as shown in FIG. 2Q in accordance with some embodiments. In some embodiments, the polishing process includes a chemical mechanical polishing (CMP) process. After the polishing process, the remaining conductive material 170 in the via openings 153 and 155 forms conductive via structures 172 and 174 that are electrically connected to the contact structure 142a and the gate structure 119a, respectively. In some embodiments, the via structures 172 and 174 have upper surfaces that are substantially level with the upper surface of the insulating layer 152, as shown in FIG. 2Q.

Embodiments of methods for forming a semiconductor device structure are provided. The formation of the semiconductor device structure includes successively forming a first insulating layer and a second insulating layer over a source/drain contact structure. Afterwards, a via opening is formed in the second insulating layer to expose the first insulating layer above the source/drain contact structure. Afterwards, the exposed first insulating layer is recessed using a first etching gas mixture to leave a portion of the first insulating layer below the via opening, and then the left portion of the first insulating layer is removed using a second etching gas mixture. The first etching gas mixture includes an oxygen gas that is capable of removing the polymer residue formed in the via opening during the recessing of the first insulating layer. As a result, the etching rate of the first insulating layer during the recessing step can be increased, thereby reducing the process time. Moreover, the via opening profile can be improved due to the removal of the formed polymer residue. In addition, the second etching gas mixture includes a hydrogen gas that is capable of preventing the source/drain contact structure from being damaged, such as corrosion or oxidation.

In some embodiments, a method for forming a semiconductor device structure is provided. The method includes forming a gate structure and a source/drain contact structure over a fin structure of a substrate. The method also includes covering the gate structure with a capping layer and covering the capping layer and the source/drain contact structure with a first insulating layer. The method also includes forming a second insulating layer over the first insulating layer and forming a via opening in the second insulating layer. The via opening exposes the first insulating layer directly above the source/drain contact structure. The method also includes recessing the exposed first insulating layer using a first etching gas mixture that includes an oxygen gas, to leave a portion of the first insulating layer below the via opening. The method also includes removing the left portion of the first insulating layer using a second etching gas mixture that includes a hydrogen gas, so as to expose the source/drain contact structure. The method also includes forming a conductive material in the via opening, so as to electrically connect the source/drain contact structure.

In some embodiments, a method for forming a semiconductor device structure is provided. The method includes forming a first insulating layer over a fin structure of a substrate and etching the first insulating layer to form an opening that exposes a source/drain region of the fin structure. The method also includes forming a first conductive layer in the opening to electrically connect the source/drain region of fin structure and forming a second insulating layer over the first insulating layer and filling the opening. The second insulating layer in the opening has a first portion adjacent to the first conductive layer and a second portion extending from a top of the first portion. The method also includes cleaning a top of the second portion of the second insulating layer using a first fluorine-containing gas, etching the second portion of the second insulating layer using an oxygen gas and a second fluorine-containing gas that is different from the first fluorine-containing gas, and etching the first portion of the second insulating layer using a hydrogen gas and the second fluorine-containing gas to expose the first conductive layer in the opening.

In some embodiments, a method for forming a semiconductor device structure is provided. The method includes forming a gate structure and a contact structure in a first insulating layer and over a fin structure of a substrate. The method also includes covering the gate structure with a capping layer and covering the capping layer and the contact structure with a second insulating layer. The method also includes forming a third insulating layer over the second insulating layer and patterning the third insulating layer to form a via opening that exposes the second insulating layer directly above the contact structure. The method also includes partially removing the second insulating layer below the via opening using a first etching gas mixture that comprises an oxygen gas and a first fluorine-containing gas, to expose a portion of the capping layer below the via opening and leave a portion of the second insulating layer below the via opening. The method also includes removing the left portion of the second insulating layer using a second etching gas mixture that comprises a hydrogen gas and the first fluorine-containing gas, to expose the contact structure. The etching rate of the second insulating layer is greater than the etching rate of the capping layer by using the first etching gas mixture and the second etching gas mixture. The method also includes forming a conductive material in the via opening, so as to electrically connect the contact structure.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a gate structure and a source/drain contact structure over a fin structure of a substrate;
   covering the gate structure with a capping layer;
   covering the capping layer and the source/drain contact structure with a first insulating layer;
   forming a second insulating layer over the first insulating layer;
   forming a via opening in the second insulating layer, wherein the via opening exposes the first insulating layer directly above the source/drain contact structure;
   recessing the exposed first insulating layer using a first etching gas mixture that comprises an oxygen gas, to leave a portion of the first insulating layer below the via opening;
   removing the left portion of the first insulating layer using a second etching gas mixture that comprises a hydrogen gas, so as to expose the source/drain contact structure; and
   forming a conductive material in the via opening, so as to electrically connect the source/drain contact structure.

2. The method as claimed in claim 1, wherein the capping layer and the first insulating layer are made of different insulating materials.

3. The method as claimed in claim 1, further comprising cleaning a top of the first insulating layer exposed from the via opening using a fluorine-containing gas as an etching gas before recessing the first insulating layer.

4. The method as claimed in claim 3, wherein the cleaning of the first insulating layer, the recessing of the first insulating layer, and the removal of the first insulating layer are performed in the same process chamber.

5. The method as claimed in claim 3, wherein a duration of the recessing of the first insulating layer is longer than a duration of the cleaning of the first insulating layer and is shorter than a duration of the removal of the first insulating layer.

6. The method as claimed in claim 3, wherein each of the first etching gas mixture and the second etching gas mixture further comprises a fluorine-containing gas that is different from the fluorine-containing gas used in the cleaning of the first insulating layer.

7. The method as claimed in claim 6, wherein the fluorine-containing gas in the first etching gas mixture and the fluorine-containing gas in the second etching gas mixture comprise $CH_3F$ and the fluorine-containing gas used in the cleaning of the first insulating layer comprises $CF_4$.

8. The method as claimed in claim 6, wherein a flow rate of the fluorine-containing gas during recessing of the first insulating layer using the first etching gas mixture is greater than a flow rate of the fluorine-containing gas during removal of the first insulating layer using the second etching gas mixture.

9. The method as claimed in claim 1, wherein the capping layer is made of metal oxide, and the first insulating layer is made of silicon nitride.

10. A method for forming a semiconductor device structure, comprising:
    forming a first insulating layer over a fin structure of a substrate;
    etching the first insulating layer to form an opening that exposes a source/drain region of the fin structure;
    forming a first conductive layer in the opening to electrically connect the source/drain region of fin structure;
    forming a second insulating layer over the first insulating layer and filling the opening, wherein the second insulating layer in the opening has a first portion adjacent to the first conductive layer and a second portion extending from a top of the first portion;
    cleaning a top of the second portion of the second insulating layer using a first fluorine-containing gas;
    etching the second portion of the second insulating layer using an oxygen gas and a second fluorine-containing gas that is different from the first fluorine-containing gas; and
    etching the first portion of the second insulating layer using a hydrogen gas and the second fluorine-containing gas to expose the first conductive layer in the opening.

11. The method as claimed in claim 10, wherein a flow rate of the second fluorine-containing gas during etching of the second portion of the second insulating layer is greater than a flow rate of the second fluorine-containing gas during etching of the first portion of the second insulating layer.

12. The method as claimed in claim 10, further comprising forming a second conductive layer over the first insulating layer in the opening after etching the first portion of the second insulating layer.

13. The method as claimed in claim 10, wherein a duration of etching the second portion of the second insulating layer is less than a duration of etching the first portion of the second insulating layer.

14. The method as claimed in claim 10, wherein the second fluorine-containing gas comprises $CH_3F$ and the first fluorine-containing gas comprises $CF_4$.

15. A method for forming a semiconductor device structure, comprising:
    forming a gate structure and a contact structure in a first insulating layer and over a fin structure of a substrate;
    covering the gate structure with a capping layer;
    covering the capping layer and the contact structure with a second insulating layer;
    forming a third insulating layer over the second insulating layer;
    patterning the third insulating layer to form a via opening that exposes the second insulating layer directly above the contact structure;
    partially removing the second insulating layer below the via opening using a first etching gas mixture that comprises an oxygen gas and a first fluorine-containing gas, to expose a portion of the capping layer below the via opening and leave a portion of the second insulating layer below the via opening; and
    removing the left portion of the second insulating layer using a second etching gas mixture that comprises a hydrogen gas and the first fluorine-containing gas, to expose the contact structure; and
    forming a conductive material in the via opening, so as to electrically connect the contact structure,
    wherein an etching rate of the second insulating layer is greater than an etching rate of the capping layer by using the first etching gas mixture and the second etching gas mixture.

16. The method as claimed in claim 15, further comprising cleaning a top of the second insulating layer exposed from the via opening using a second fluorine-containing gas before partially removing the second insulating layer, wherein the second fluorine-containing gas is different from the first fluorine-containing gas, and wherein the cleaning of the top of the second insulating layer and the removal of the second insulating layer are performed in the same process chamber.

17. The method as claimed in claim 16, wherein the first fluorine-containing gas comprises $CH_3F$ and the second fluorine-containing gas comprises $CF_4$.

18. The method as claimed in claim 15, wherein a flow rate of the second fluorine-containing gas while partially removing the second insulating layer using the first etching gas mixture is greater than a flow rate of the first fluorine-containing gas during the removal of the second insulating layer using the second etching gas mixture.

19. The method as claimed in claim 18, wherein a duration of the removal of the second insulating layer using the first etching gas mixture is less than a duration of the removal of the second insulating layer using the second etching gas mixture.

20. The method as claimed in claim 15, wherein the second insulating layer is made of silicon nitride.

* * * * *